(12) United States Patent
Voigtlaender (10) Patent No.: US 6,879,219 B2
(45) Date of Patent: Apr. 12, 2005

(54) HIGH FREQUENCY OSCILLATOR WITH VERTICAL RESONATOR

(75) Inventor: Klaus Voigtlaender, Wangen (DE)

(73) Assignee: Robert Bosch GmbH, Stuttgart (DE)

( * ) Notice: Subject to any disclaimer, the term of this patent is extended or adjusted under 35 U.S.C. 154(b) by 118 days.

(21) Appl. No.: 10/457,296

(22) Filed: Jun. 9, 2003

(65) Prior Publication Data

US 2003/0231071 A1 Dec. 18, 2003

(30) Foreign Application Priority Data

Jun. 12, 2002 (DE) .......................................... 102 26 038

(51) Int. Cl.⁷ .......................... H03B 5/18; H03B 7/12; H01P 7/10
(52) U.S. Cl. ...................................... 331/96; 333/219.1
(58) Field of Search ............................ 331/96, 107 DP, 331/117 D; 333/219.1

(56) References Cited

U.S. PATENT DOCUMENTS 4,630,012 A * 12/1986 Fuller et al. ................. 333/235
5,701,104 A    12/1997 Heide

OTHER PUBLICATIONS

D. Kajfez and P. Guillon: "Dielectric Resonators", Artech House Books, 1986, pp. 9–26, 379–388.
I. Bahl et al: "Microwave Solid State Circuit Design", Wiley 1988, pp. 426–482.

* cited by examiner

Primary Examiner—David Mis
(74) Attorney, Agent, or Firm—Michael J. Striker (57) ABSTRACT

A high frequency oscillator includes a dielectric, cylindrical resonator (DR) as a frequency-determining element. The dielectric resonator (DR) is arranged vertically on a substrate (S) on its shell. The resonator (DR) is formed as a hoop, such that the field intensity in the region of the outer edge of the hoop is at a maximum and in the center, is null, that is field-free.

5 Claims, 9 Drawing Sheets

HIGH FREQUENCY OSCILLATOR WITH VERTICAL RESONATOR

BACKGROUND OF THE INVENTION

The present application relates to a high frequency oscillator with a vertical, dielectric resonator as a frequency-determining component.

It is-known to use horizontal dielectric resonators (DR) as frequency-determining components for microwave oscillators. For increasing the performance, often these are placed on a ring-shaped spacer made from materials with low dielectric constants and operate in H110-mode. As oscillators, reflection types or transmission types (feedback types) are used (D. Kajfez and P. Guillon eds.: Dielectric Resonators, Artech House books (1986); I. Bahl et al: Microwave Solid State Circuit Design, Wiley (1988) pp. 426–482).

Horizontal resonators are difficult to balance and have a generally inadequate performance.

From U.S. Pat. No. 5,701,104, the use of vertical resonators is known. These are operation in rotationally symmetrical modes, for example, TM21+delta. By means of the other types of coupling, an increased performance can be achieved as with horizontal resonators.

The high frequency oscillator in a planar style known from U.S. Pat. No. 5,701,104 comprises an amplifier, planar lines, a substrate, and a dielectric resonator as a frequency-determining element, whereby the dielectric resonator is formed as a cylinder and is arranged vertically on its surface or shell directly or indirectly on or in the substrate. The cylindrical cross sectional shape can be circular or oblate. The resonator can have a bore (hole) in its front face.

SUMMARY OF THE INVENTION

It is an object of the present invention to provide an oscillator with a vertical dielectric resonator, which is compactly formed and is equalized with simple means.

This object is solved by an oscillator of the above-type, with the characteristics of the present invention.

The inventive oscillator, in contrast to the known oscillators, offers the advantages that a simple mounting by means of the flattened portion is possible, that by means of the selection of an elliptical shape of the resonator, a small height can be realized, that the symmetrical or asymmetrical hole (bore) of the resonator permits material savings, in particular, tantalum, and that the resonator is operated in higher modes.

In a preferred embodiment of the invention, the vertical resonator arranged on a substrate is elliptically formed and has a bore displaced to its center inclined downwardly.

DETAILED DESCRIPTION OF THE PREFERRED EMBODIMENTS

In FIG. 1, known forms of resonators DR are illustrated.

Figure 1A:
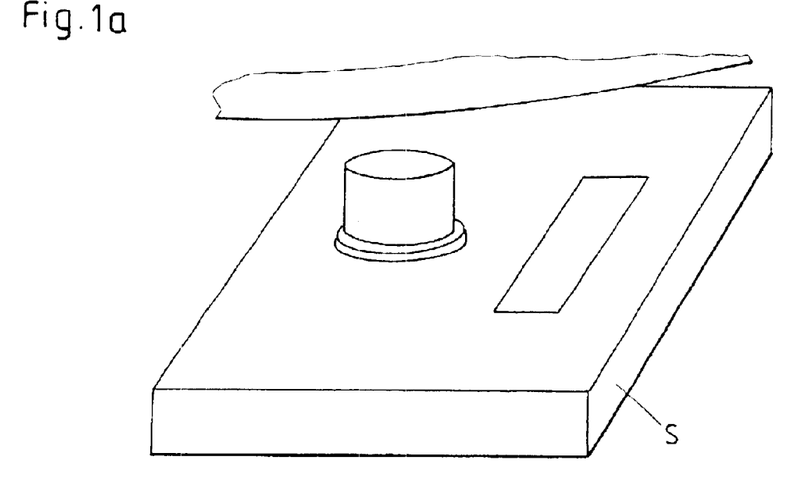
FIG. 1 is a schematic representation of known forms of resonators according to the state of the art.
Figure 1B:
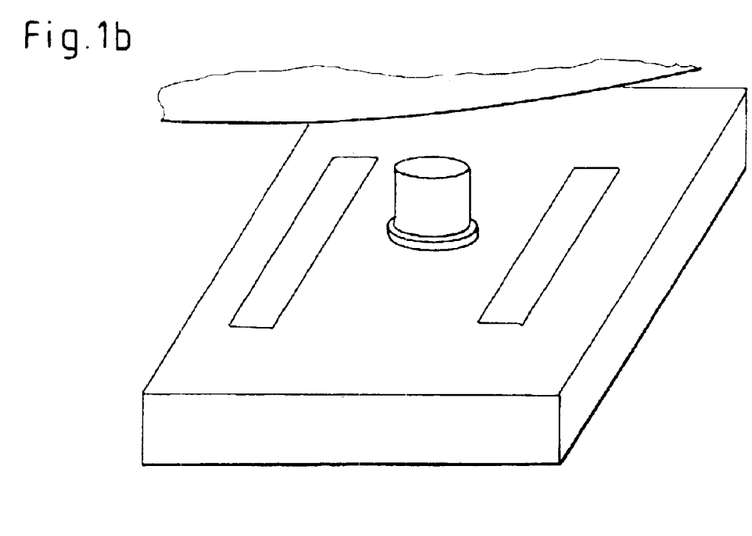

For reflecting and transmitting oscillators, the forms corresponding to the representation in FIGS. 1a and 1b are used (classic methods in band stop and band pass methods).

Figure 1C:
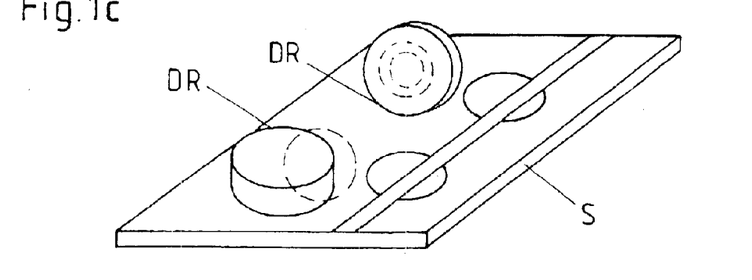

In FIG. 1c, the classic and the proposed form of the resonators according to U.S. Pat. No. 5,701,104 are shown.

Calculations on horizontal resonators have shown that in addition to know TM021 modi known from the state of the art, a multitude of other possibilities of stimulation are provided. With a stimulation of the TE310 or TE410 modi, the field intensity reaches a maximum sized in a ring in the region of the outer edge and in the center, null, that means, the center is field-free.

Figure 2:
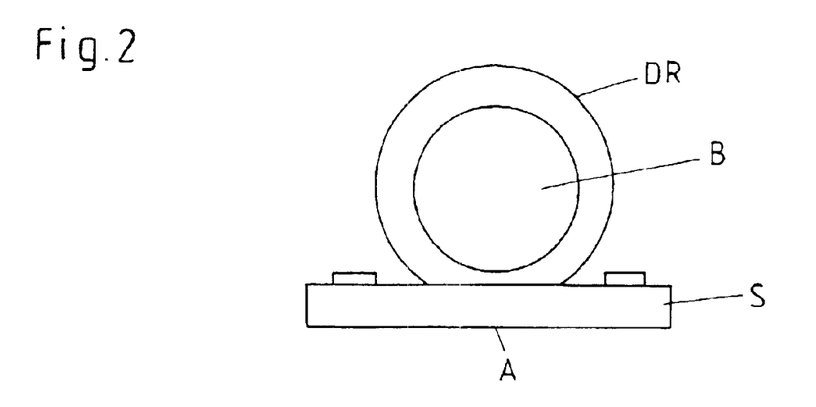
FIG. 2 is a schematic representation of a ring-shaped resonator with a bore, which stands with an oblate side on a substrate.
Figure 3:
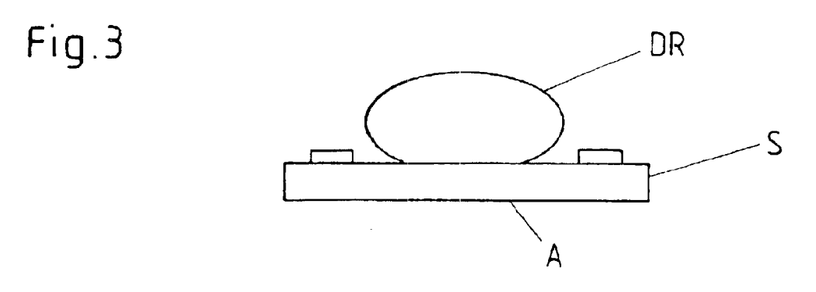
FIG. 3 is a schematic representation of an elliptical resonator, which stands with an oblate side on a substrate.
Figure 4:
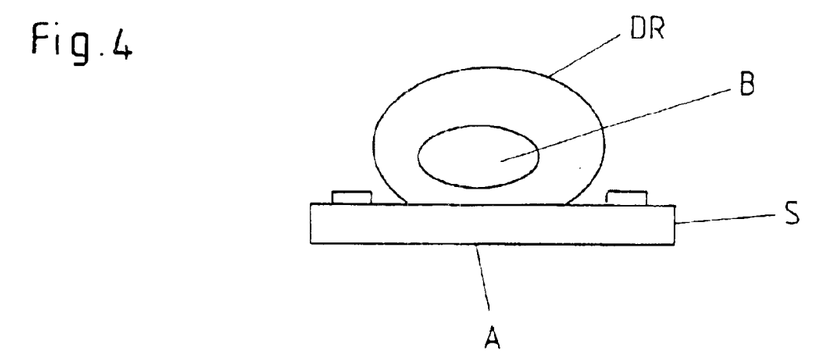
FIG. 4 is a schematic representation of an elliptical resonator with an elliptical bore, which stands with the oblate side on a substrate.

One embodiment of the vertical resonator DR in a hoop form is shown in FIGS. 2 through 4.

This structure makes possible the use of dielectric with high dielectric constants (er=30 to 80), in addition to material savings, so that a compact structure can be achieved.

In FIG. 2, the hoop-shaped, vertical resonator DR with a flat side, flattened portion A, is provided, in order to be better positioned. In this manner, mountings or supports are not necessary. The center bore B can also be displaced and/or slanted downwardly. With these features, an adaptation of the coupler coefficients is made possible. A displaced bore B that slants downwardly or is displaced parallel downwardly can be used with an advantage with a reflection type.

Compared with the horizontally arranged resonators, with vertical resonators, the advantage of a minimal cover manipulation are provided, since the distances from the front faces of the resonator to the surrounding metal (housing, shielding and the like) are sufficiently large. Therefore, the oscillator oscillates slightly and can be tested for its resonance without a cover. It is possible to pre-equalize the resonators DR before their installation into the circuit. In this regard, a considerable manufacturing advantage is provided.

In the embodiment shown in FIG. 3, the resonator DR arranged vertically on the substrate S is elliptically formed, in order to achieve a lower height than previously known. Also, this resonator DR can be operated in higher modi and therefore, has a very high performance.

FIG. 4 shows the embodiment according to FIG. 3, however, with a bore B, so that additional modi are suppressed in the center with a maximum.

The embodiments of the resonators DR according to FIGS. 2 through 4 require no ring-shaped distance piece because of the small contact surface.

Figure 5:
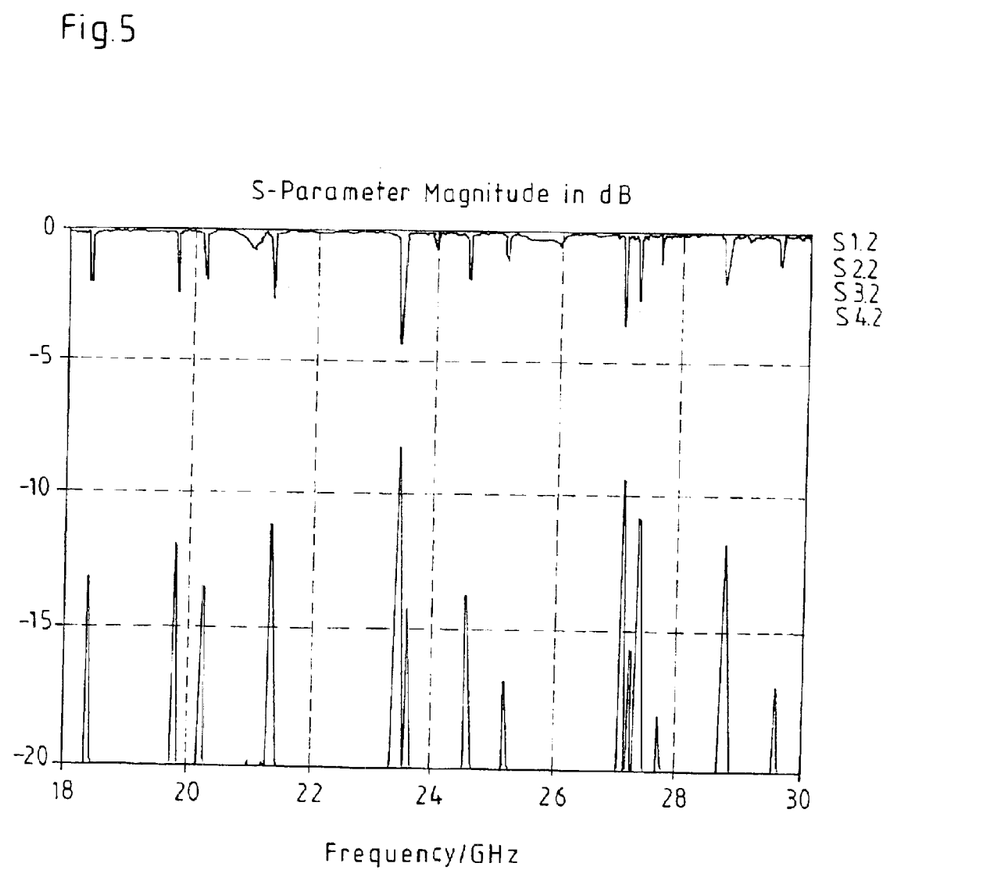
FIG. 5 is a graphical representation of the 4-Tor S-Parameter for a resonator according to FIG. 2.
Figure 6:
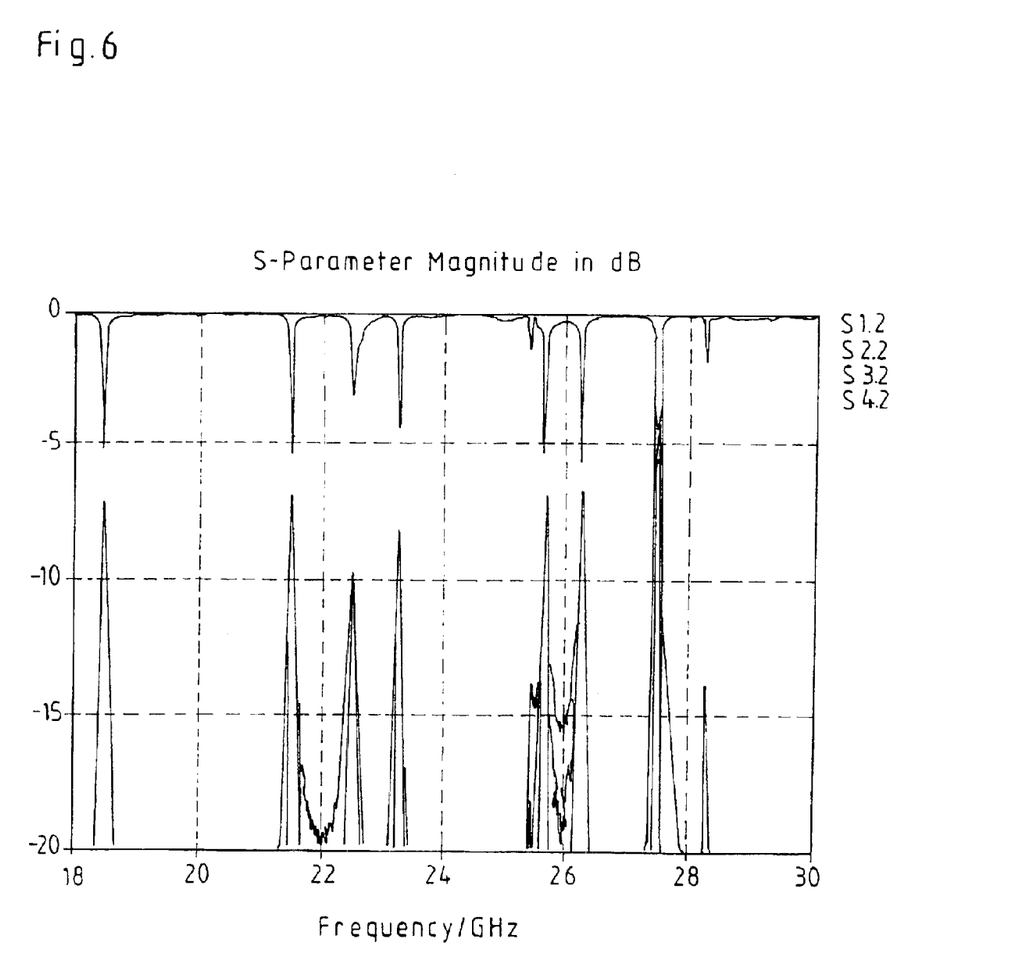
FIG. 6 is a graphical representation of the 4-Tor S-Parameter for a resonator according to FIG. 3.
Figure 7:
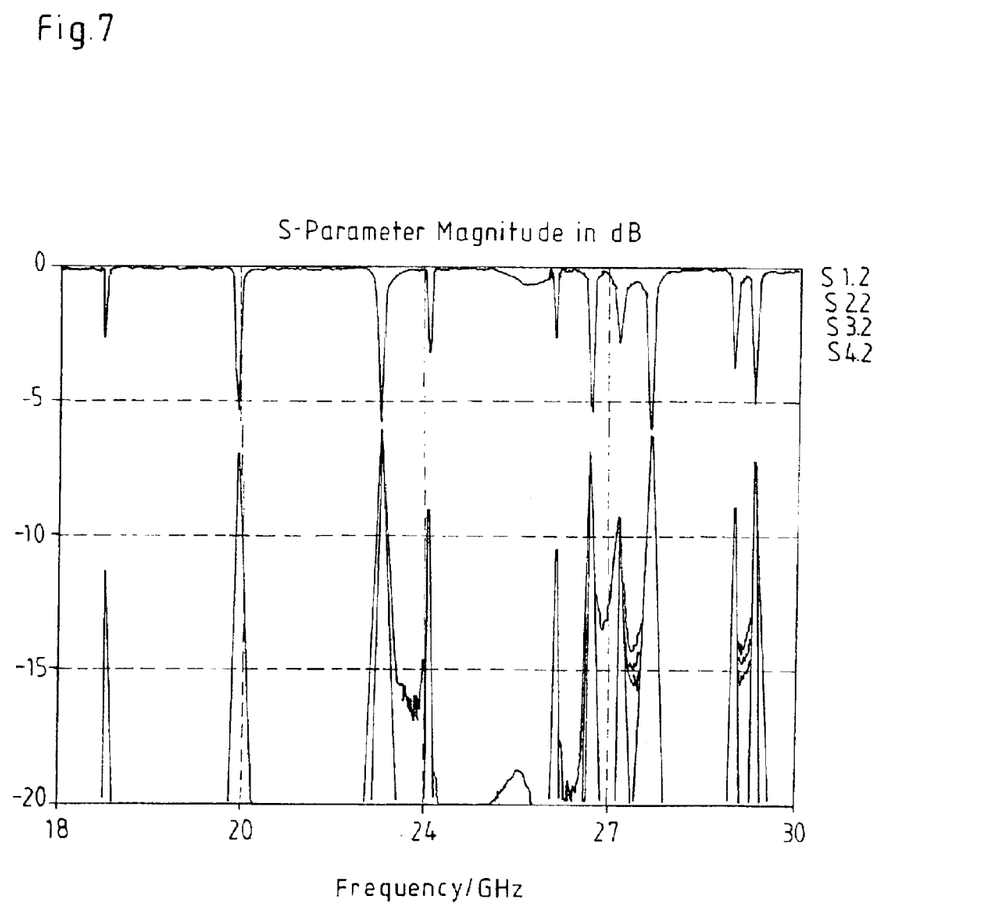
FIG. 7 is a graphical representation of the 4-Tor S-Parameter for a resonator according to FIG. 4.

FIGS. 5 through 7 show the graphical representation of the 4-Tor S-Parameter, respectively, for a resonator according to FIGS. 2 through 4.

Figure 8:
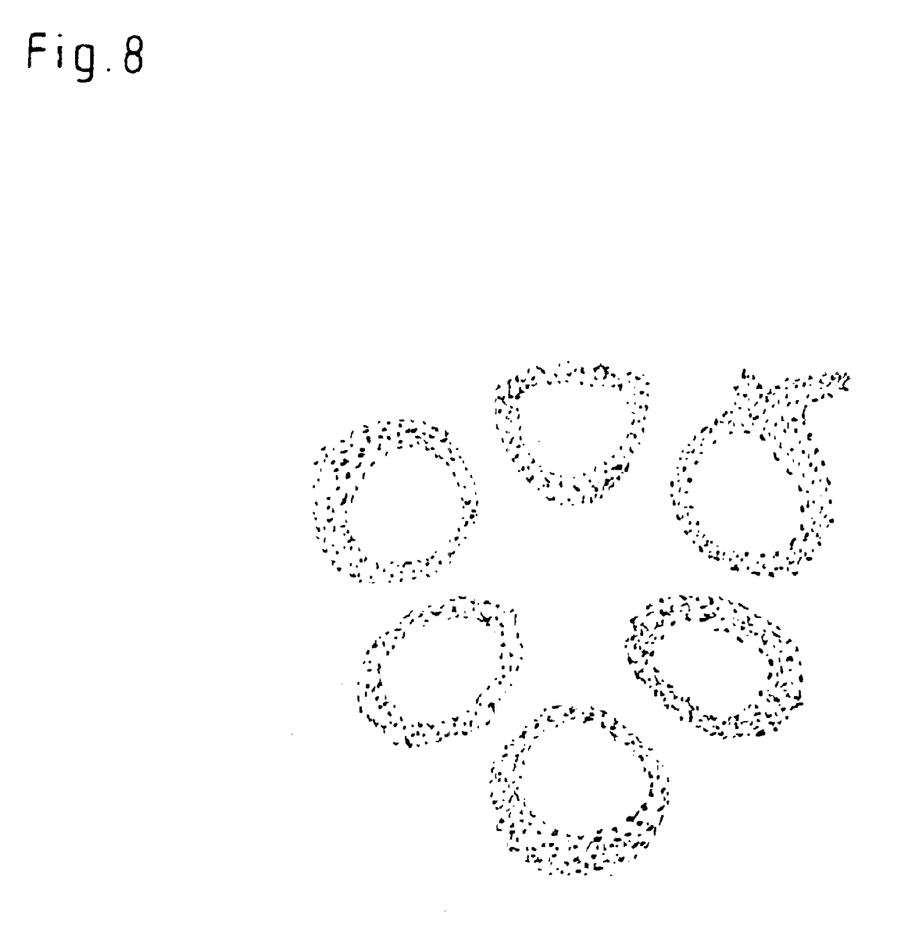
FIG. 8 is the modi H31.
Figure 9:
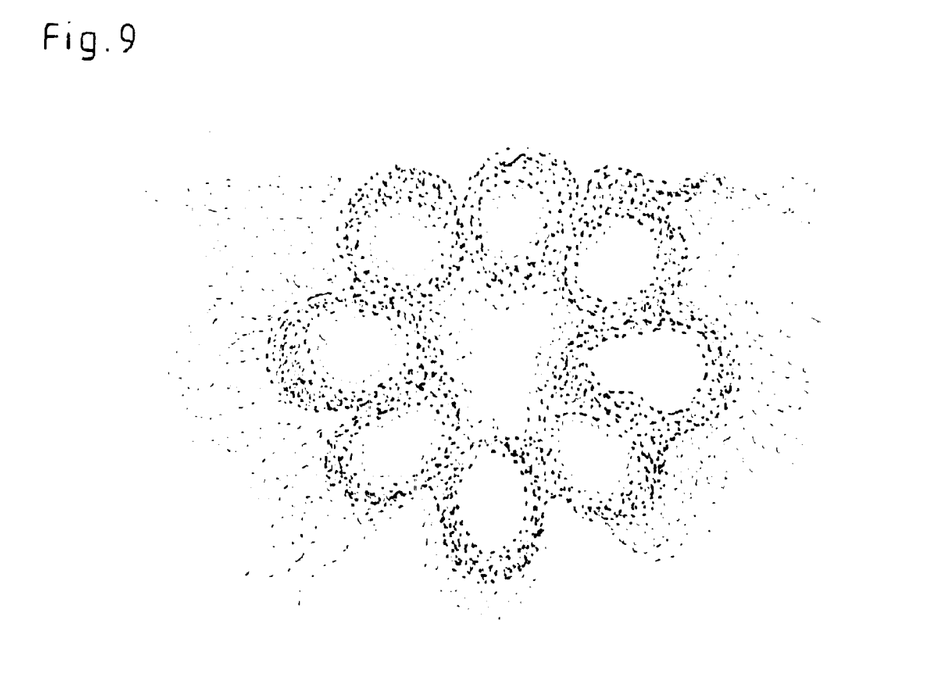
FIG. 9 is the modi H41.
Figure 10:
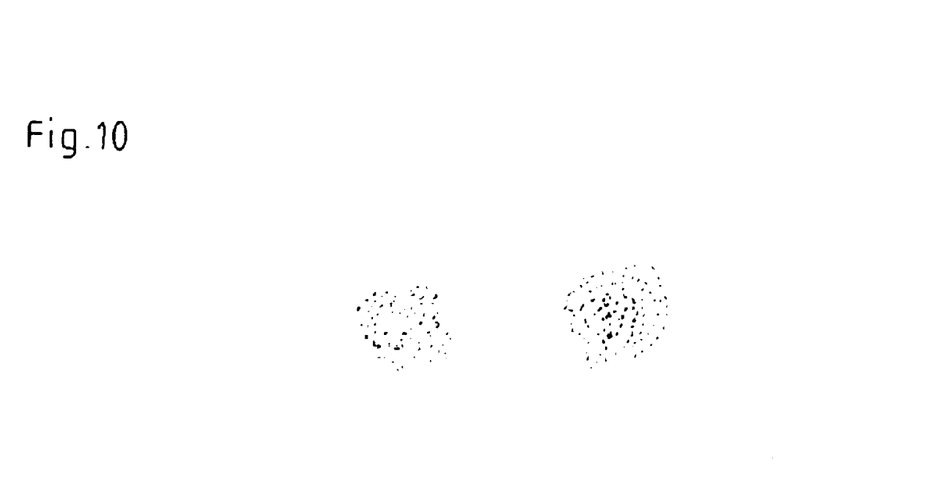
FIG. 10 is a line of flux illustration for 2 maxima without hole.
Figure 11:
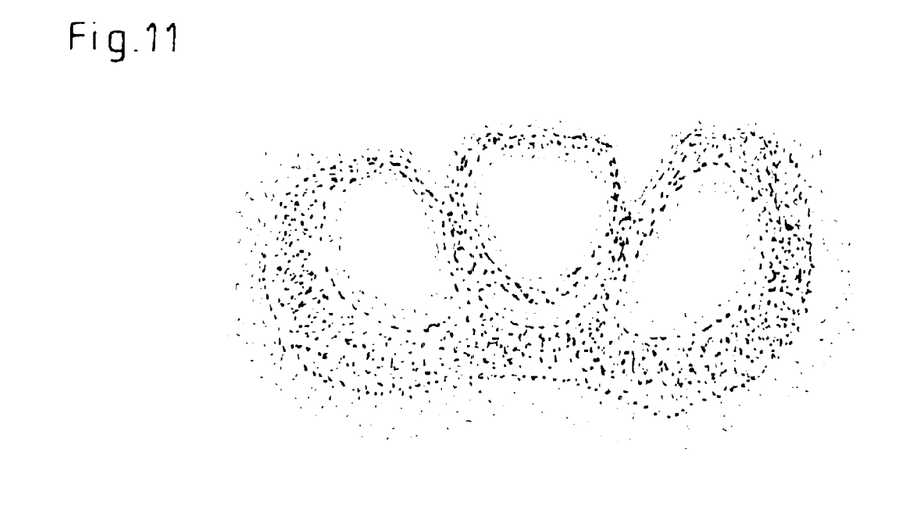
FIG. 11 is a line of flux illustration for 3 maximum without hole.
Figure 12:
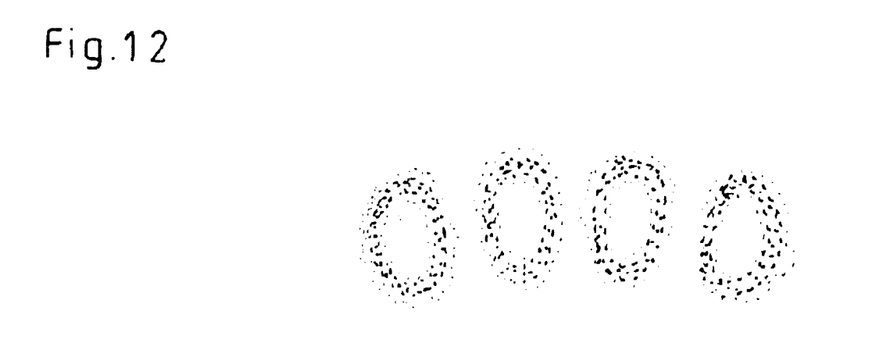
FIG. 12 is a line of flux illustration for 4 maxima without hole.
Figure 13:
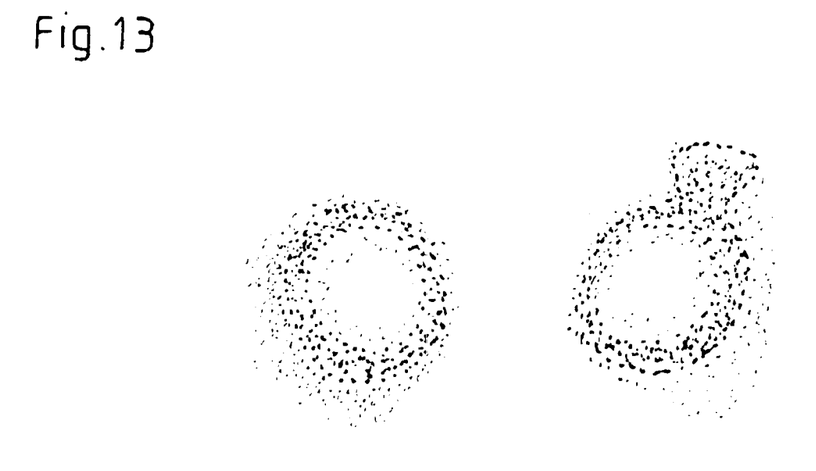
FIG. 13 is a line of flux illustration for 2 maxima with hole.
Figure 14:
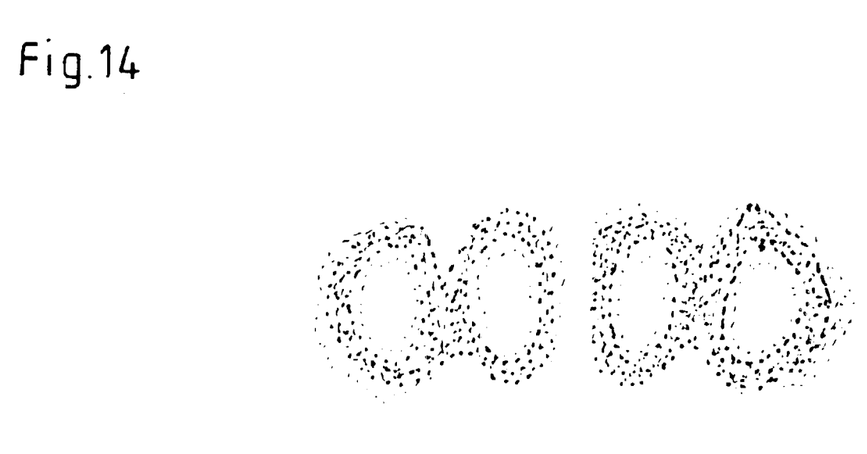
FIG. 14 is a line of flux illustration for 4 maxima without hole.

FIGS. 8 and 9 show the modi H31 and H41, and FIGS. 10 through 14 show the line of flux illustrations for 2, 3, 4 maxima without a hole (bore), whereby because of the provided bore here in the center, no modi with three maxima occur.

It will be understood that each of the elements described above, or two or more together, may also find a useful application in other types of constructions differing from the types described above.

While the invention has been illustrated and described herein as a high-frequency oscillator with a vertical resonator, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

What is claimed is:

1. High frequency oscillator with a dielectric, cylindrical resonator (DR) as a frequency-determining element, wherein the dielectric resonator (DR) is arranged vertically on its surface on a substrate (S), characterized in that the resonator (DR) is formed as a hoop, such that the field intensity in the region of an outer edge of the hoop is at a maximum and in a center, is null, that is, field-free.

2. High frequency oscillator according to claim 1, characterized in that the resonator (DR) is elliptically formed.

3. High frequency oscillator according to claim 1, characterized in that the resonator (DR) is formed to be oblate on its surface at at least one point (A) for positioning without mountings or supports.

4. High frequency oscillator according to claim 1, characterized in that in the resonator (DR) for fitting of coupler coefficients, a bore (B) displaced to the center of the resonator is arranged.

5. High frequency oscillator according to claim 4, characterized in that the bore (B) in the resonator (DR) is displaced slanting downwardly or parallel downwardly.

* * * * *